United States Patent
Chen et al.

(10) Patent No.: US 6,891,495 B2
(45) Date of Patent: May 10, 2005

(54) ANALOG-TO-DIGITAL CONVERTER

(75) Inventors: Jiann-Jong Chen, Junghe (TW);
Po-Jen Huang, Shinjuang (TW);
Hung-Yih Lin, Toucheng Jen (TW);
Cheng-Tung Wang, Lingkou Shiang (TW)

(73) Assignee: Endpoints Technology Corporation, Taipei (TW)

( * ) Notice: Subject to any disclaimer, the term of this patent is extended or adjusted under 35 U.S.C. 154(b) by 0 days.

(21) Appl. No.: 10/453,378

(22) Filed: Jun. 2, 2003

(65) Prior Publication Data
US 2004/0080446 A1 Apr. 29, 2004

(30) Foreign Application Priority Data
Oct. 24, 2002 (TW) .......................... 91124770 A

(51) Int. Cl.[7] .................................................. H03M 1/38
(52) U.S. Cl. ....................................... 341/161; 341/135
(58) Field of Search ................................ 341/135, 155, 341/161, 144

(56) References Cited

U.S. PATENT DOCUMENTS

| | | | | |
|---|---|---|---|---|
| 4,675,651 A | * | 6/1987 | Marbot et al. | 341/135 |
| 5,283,582 A | * | 2/1994 | Krenik | 341/158 |
| 5,963,158 A | * | 10/1999 | Yasuda | 341/136 |
| 5,990,820 A | * | 11/1999 | Tan | 341/161 |
| 6,167,132 A | * | 12/2000 | Krone et al. | 379/399.01 |
| 6,492,930 B2 | * | 12/2002 | Enriquez | 341/155 |
| 6,507,523 B2 | * | 1/2003 | Pekny | 365/189.09 |
| 6,567,023 B1 | * | 5/2003 | Iwata | 341/126 |

* cited by examiner

*Primary Examiner*—Peguy JeanPierre
(74) *Attorney, Agent, or Firm*—Ladas & Parry LLP

(57) ABSTRACT

An analog-to-digital converter including analog-to-digital converting units connected in serial. The current comparator includes a current input terminal to receive a sampling current, a reference current input terminal to receive a reference current and a bit output terminal for outputting a bit signal. The current operation circuit includes a current output terminal for outputting a compared current according to the sampling current and the reference current. The operation controlling terminal selects the compared current according to the bit signal. The controlling terminal receives a clock signal to latch the bit signal. The analog-to-digital converting units output the bit signals in sequence in a period of the clock signal.

19 Claims, 9 Drawing Sheets

US 6,891,495 B2

ANALOG-TO-DIGITAL CONVERTER

BACKGROUND OF THE INVENTION

1. Field of the Invention

The present invention relates in general to an analog-to-digital converter. In particular, the present invention relates to a current-mode chain-reaction analog-to-digital converter.

2. Description of the Related Art

In many mixed-signal systems, analog-to-digital converters (ADC) are required for interfacing analog signals to digital circuits. The requirement is usually to integrate these ADCs with digital signal processors (DSP) in a low-cost CMOS technology. However, due to reliability issues, the supply voltages for advanced CMOS processes have been continuously reduced and will be further reduced to 1.5V and below in the near future. As a result, ADCs integrated with a DSP are required to operate in the same range of supply voltage. However, designing an ADC to operate at such a low supply voltage presents a great challenge, due to the fact that the threshold voltage of MOSFET devices are relatively high for the given supply voltage ranges even for future CMOS processes. To address this challenge, different techniques have been used to realize low-voltage ADCs including the use of specialized processes that provide low-threshold devices, bootstrap techniques, and switched-op-amp techniques. For the 0.25 um CMOS process, the ADC of the chip has a poor transforming characteristic when operating at 1.5V~2.5V. Thus, a voltage converter is required for the DAC circuit to raise the operation voltage to 3.3V or higher. However, the chip size and the cost of the circuit increase, and noise, short-channel effects and chip latching also occurs.

SUMMARY OF THE INVENTION

The object of the present invention is to provide a chain-reaction analog-to-digital converter (ADC) manufactured with the conventional CMOS process. The ADC according to the present invention only requires one or two capacitors. Thus, the size of the ADC chip is reduced. In addition, the signal transformation from analog to digital by the ADC according to the present invention only requires a single clock period.

To achieve the above-mentioned object, the present invention provides an analog-to-digital converter including analog-to-digital converting units connected in serial. The current comparator includes a current input terminal to receive a sampling current, a reference current input terminal to receive a reference current and a bit output terminal for outputting a bit signal. The current operation circuit includes a current output terminal for outputting a compared current according to the sampling current and the reference current. The operation controlling terminal selects the compared current according to the bit signal. The controlling terminal receives a clock signal to latch the bit signal. The analog-to-digital converting units output the bit signals in sequence in a single period of the clock signal.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
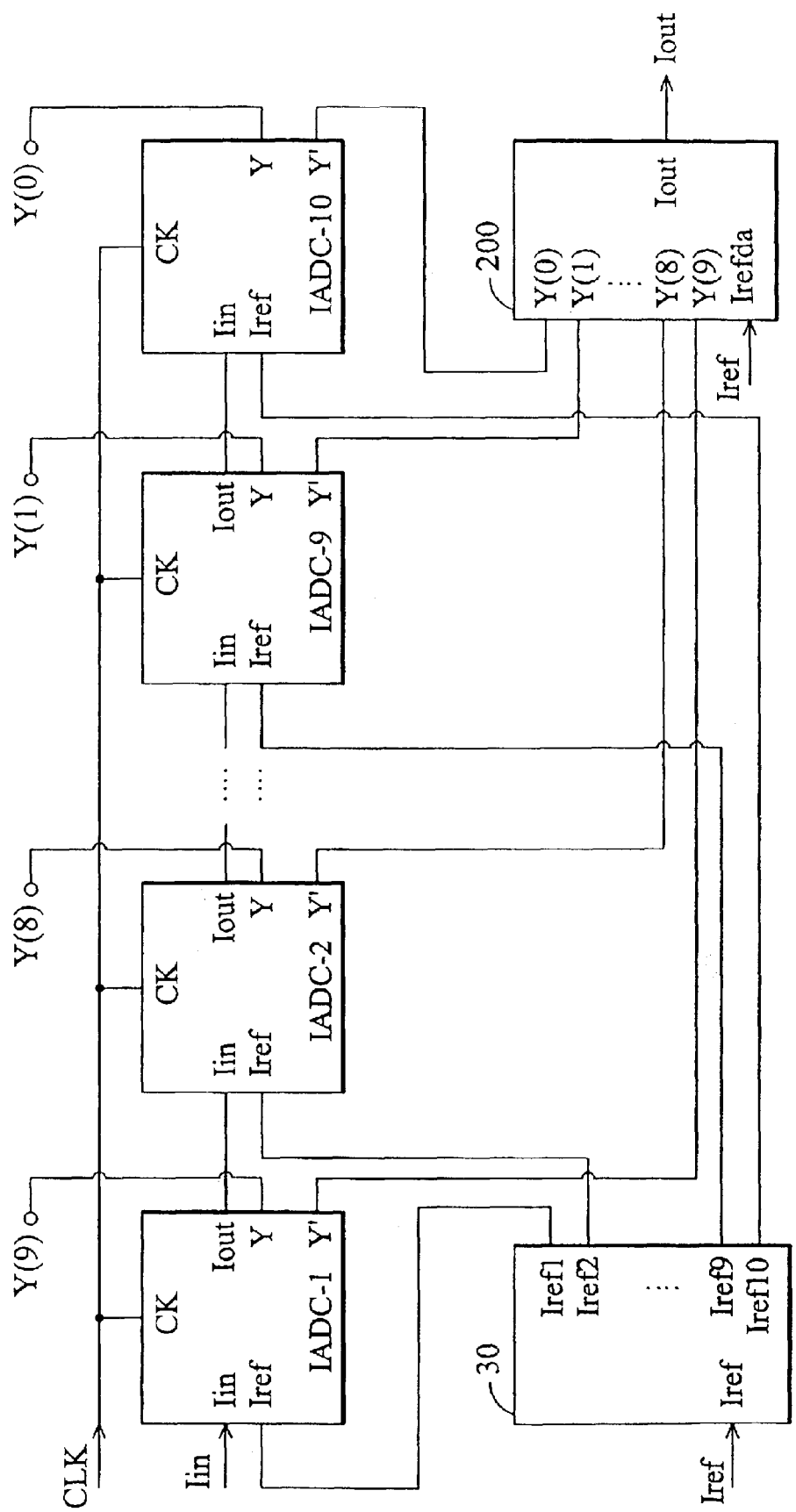
FIG. 1 shows a schematic diagram of the ADC according to the embodiment of the present invention.

FIG. 1 shows a schematic diagram of the ADC according to the embodiment of the present invention. As shown in FIG. 1, the ADC according to the embodiment of the present invention comprises a reference current circuit 30, and the analog-to-digital converting units IADC-1~IADC-10. The digital-to-analog converter (DAC) 200 is used for testing the ADC 100. In the present embodiment, the input analog signal of the analog-to-digital converting unit IADC-1 is the current Iin. The digital output signal of the analog-to-digital converting unit IADC-1~IADC-10 is 10 bits data, the bits signals are Y(9)~Y(0) from MSB to LSB.

The analog-to-digital converting unit IADC-1~IADC-10 comprise a serial chain. Each analog-to-digital converting unit comprises a current input terminal Iin for receiving a sampling current, a bit output terminal Y for outputting the bit signal, a current output terminal Iout for outputting a comparing current, and a controlling terminal CK for receiving clock signal CLK to latch the bit signal. The current input terminal Iin of each analog-to-digital converting unit is coupled to the current output terminal Iout of the pre-stage analog-to-digital converting unit, which is a higher bit analog-to-digital converting unit. In a period of the clock signal CLK, the chain of the analog-to-digital converting units output all bit signals Y(9)~Y(0).

Figure 2:
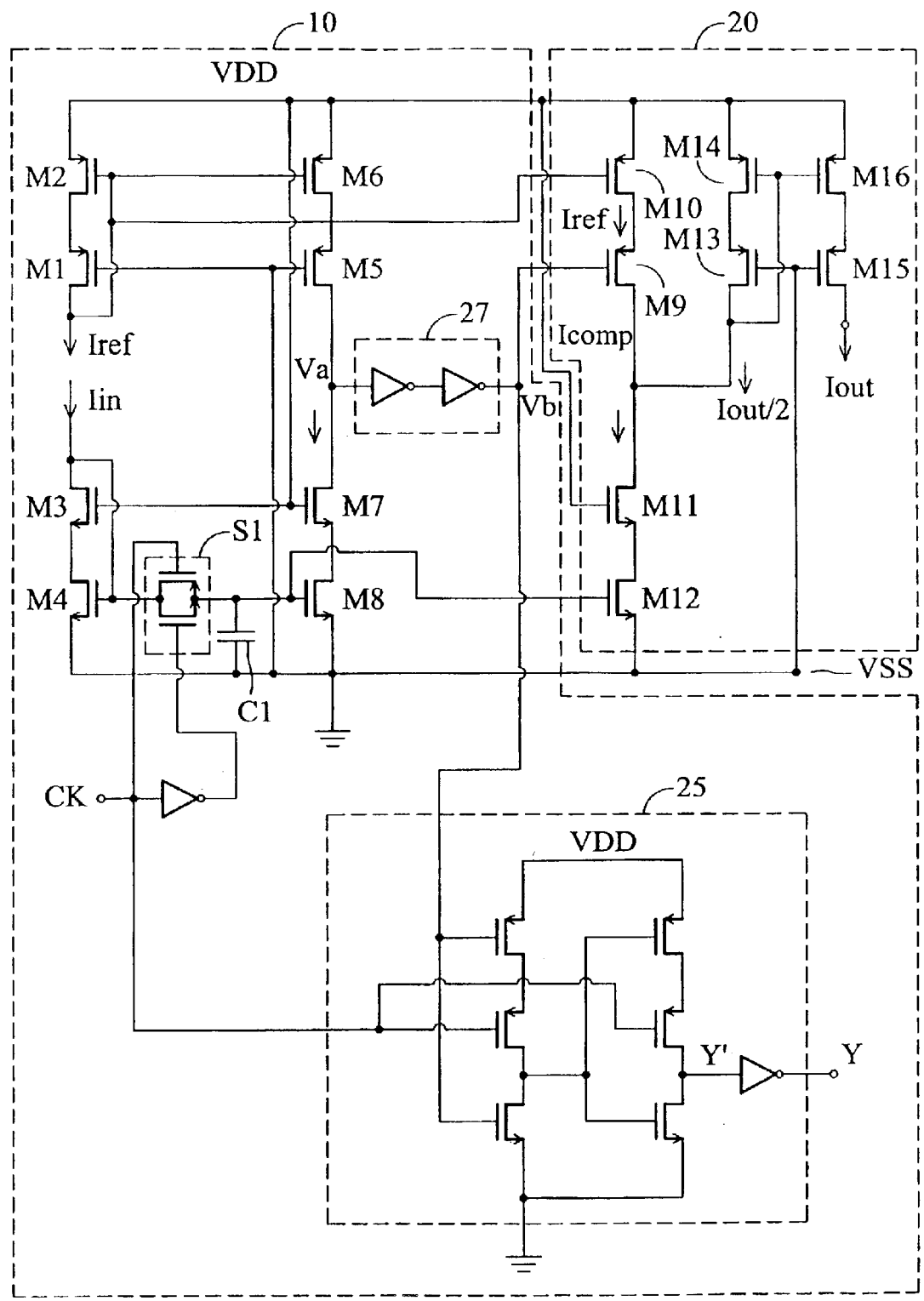
FIG. 2 shows an analog-to-digital converting unit comprising a sampling latching circuit.

FIG. 2 shows an analog-to-digital converting unit comprising a sampling latching circuit. The analog-to-digital converting unit comprises a current comparing circuit 10 and a current operation circuit 20. The current comparing circuit 10 includes a comparator 27, a raising current mirror composed of the transistors M1, M2, M5 and M6, and a lowering current mirror composed of the transistors M3, M4, M7 and M8. The current operation circuit 20 comprises the raising cascade transistors M9 and M10, the lowering cascade transistors M11 and M12, and an output current mirror composed of transistors M13, M14, M15 and M16. The analog-to-digital converting unit with the sampling latching circuit is used as the unit at the highest bit (IADC-1). When the clock signal CLK is enabled, the switch S1 is turned on, and the capacitor C1 samples the bias at the gate of the transistor M4. Thus, the current mirror composed of the transistors M3, M4, M7 and M8 samples the input current Iin and compares the input current with a reference current to obtain the bit value Y(9). The current at the current output terminal Iout is the sampling current and the comparing current Icomp provided to the next stage analog-to-digital converting unit. When the clock signal is disabled, the switch S1 is turned off, and the capacitor C1 maintains the bias at the gate of the transistor M8. Thus, the current passing through the transistors M7 and M8 is fixed. In addition, the comparing operation of the input current Iin and the reference current is generated by the current difference between the discharge current copied by the current mirror composed of the transistors M1, M2, M5 and M6, and the charging current copied by the current mirror composed of the transistors M3, M4, M7 and M8 at the terminal Va to charge or discharge the voltage level of the terminal Va. Thus, the bit value is obtained at the terminal Vb through the comparator 27. The inverter latch 25 latches the bit value at the terminal Vb when the clock signal CLK is enabled. The terminal Va is charged to the high voltage level by the current difference of the reference current Iref and the input current Iin when the input current Iin is less than the reference current Iref. Thus, the terminal outputs a low-level bit value Y(i) through the inverter latch 25. The terminal Va is discharged to low voltage level by the current difference of the reference current Iref and the input current Iin when the input current Iin exceeds the reference current Iref. Thus, the terminal outputs a high-level bit value Y(i), through the inverter latch 25. Here, the raising current mirror, lowering current mirror, the comparator 27 and the inverter latch 25 comprise a current comparator.

Figure 3:
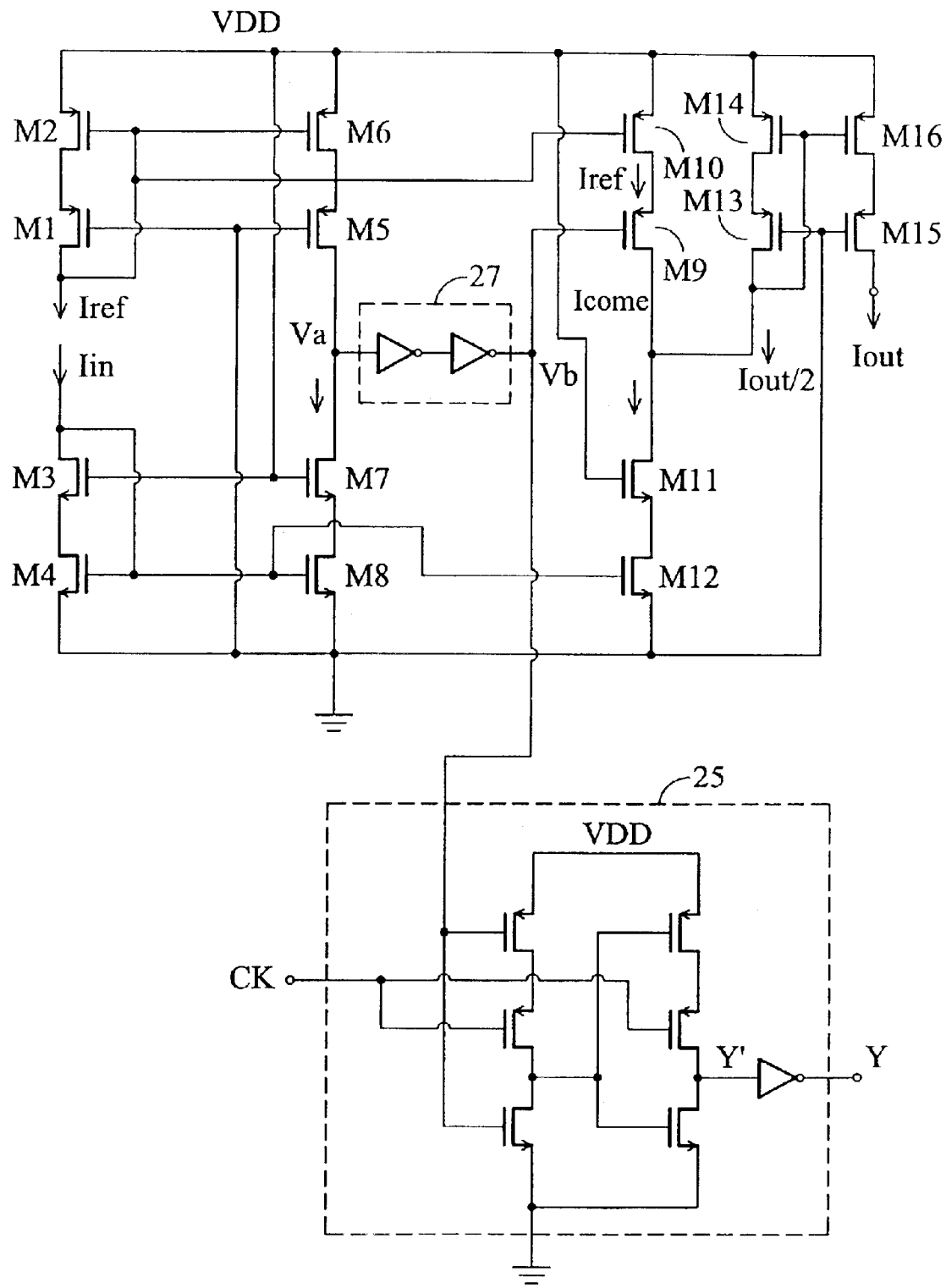
FIG. 3 shows an analog-to-digital converting unit without a sampling latching circuit.

FIG. 3 shows an analog-to-digital converting unit without a sampling latching circuit. Compared with FIG. 2, the switch S1 and capacitor C1 are removed. The analog-to-digital converting unit IADC-2~IADC-10 receive fixed current at the input terminals when the analog-to-digital converting unit IADC-1 receives fixed input current and outputs fixed comparing current. Thus, only one capacitor is used in the digital-to-analog converter according to the embodiment of the present invention, and the size of the circuit is obviously decreased.

Figure 4:
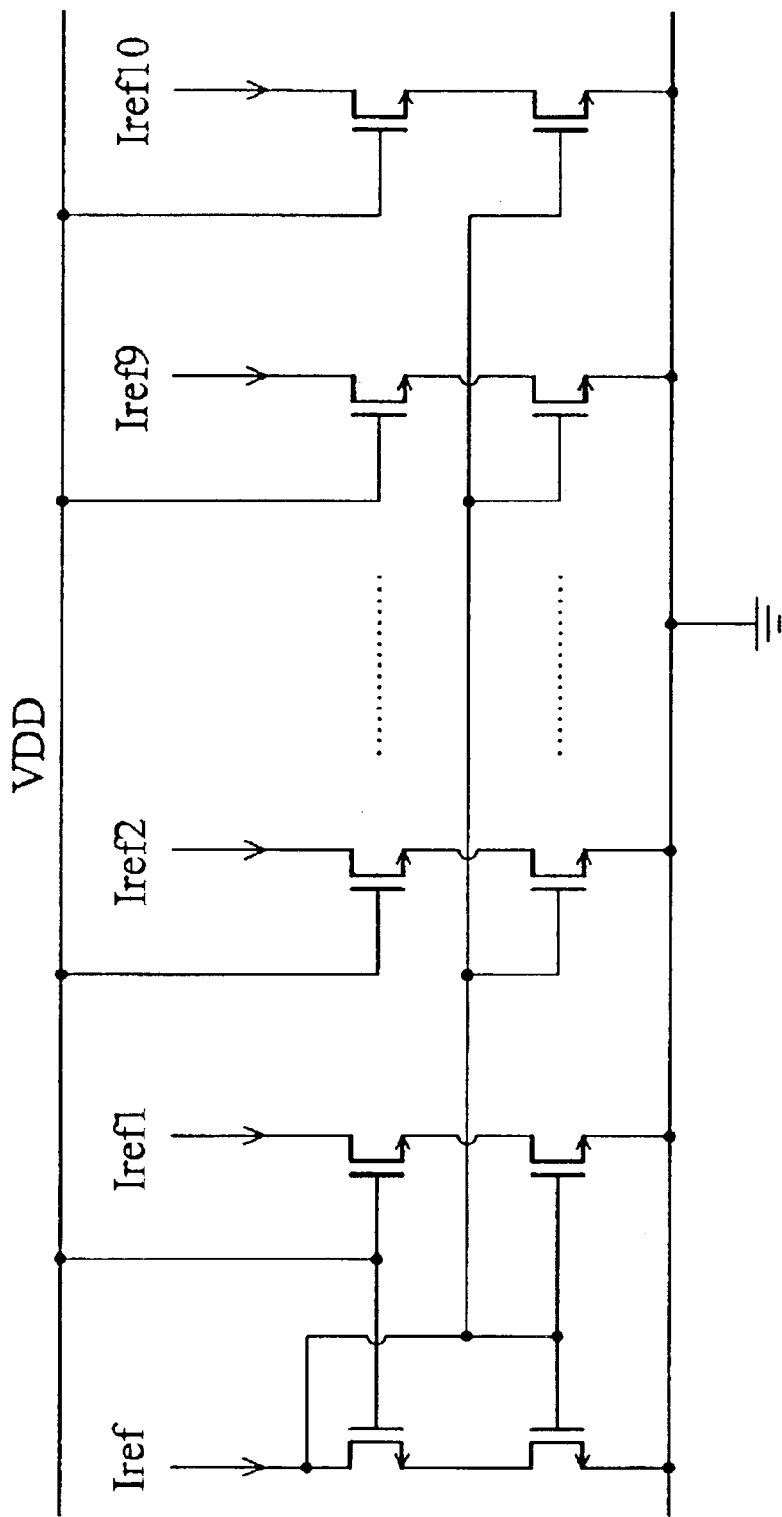
FIG. 4 shows a circuit of the reference current generator 30.

FIG. 4 shows a circuit of the reference current generator 30. The reference current generator 30 comprises a plurality of current mirror to output reference currents Iref1–Iref10 to analog-to-digital converting unit IADC-1~IADC-10, respectively.

The raising cascade transistors M9 and M10 and the lowering cascade transistors M11 and M12 generate the current Icomp. The current Icomp is determined according to the bit value. The transistor switches the current Icomp to the input current or the current difference between the input current and the reference current according to the bit value. The resistance of the MOSFET does not match the current. Thus, the raising current mirror is a cascade type comprising transistors M1 and M5 to matching the raising cascade transistors M9 and M10. In addition, the increased output impedance aids current matching. The voltage level of the output terminal Vb of the comparator 27 is closed to Vss. Thus, the gates of the transistors M5 and M1 are coupled to Vss to cause the current of the raising current mirror to match the current of the lowering current mirror. The cascade current mirror, however, limits the operational range of the output terminal, especially under a low operating voltage. Thus, a current mirror capable of wide variation is required. The reference current Iref is used as a current source. The gate of the transistor M2 is coupled to the drain of the transistor M1. In addition, the gate of the transistor M6 is coupled to the drain of the transistor M1, thus, the reference current Iref is copied. The gates of the transistors M1 and M5 are coupled to the ground Vss. Here, the output current of the transistor M5 is the same as the reference current Iref. Thus, the output current of the transistor M5 is the same with the reference current Iref. In addition, the output current of the transistor M5 matches that of the transistor M9. Similarly, the transistors M3, M4, M7, and M8 comprise a current mirror capable of wide variation. The transistors M8 and M7 copy the input current Iin. That is, the output current of the transistor M7 is equal to the input current Iin.

When the input current Iin is less than the reference current Iref, the difference between the input current Iin and the reference current Iref charges the terminal Va. Thus, the voltage level of the terminal Va is high. Then the voltage level of the terminal Vb is also high and reaches Vdd through the comparator 27. Thus, the transistor M9 is turned off, and the transistors M3, M4, M11 and M12 comprise a current mirror with wide variation. The transistors M11 and M12 copy the input current Iin, thus, the current passing through the transistor M13 is the same as the input current Iin. In addition, the transistors M13, M14, M15 and M16 comprise an output current mirror. Here, the width of the transistors M15 and M16 are twice that of the transistors M13 and M14. Thus, the value of the output current Iout is twice the input current Iin.

When the input current Iin exceeds the reference current Iref, the difference between the input current Iin and the reference current Iref discharges the terminal Va. Thus, the voltage level of the terminal Va is low. The voltage level of the terminal Vb is then also low and reaches Vss through the comparator 27. In addition, the voltage of the gate of the transistor M1 is also low. Thus, the transistors M1, M2, M9 and M10 comprise a current mirror with wide variation. The transistors M9 and M10 copy the reference current Iref. In addition, the transistors M3, M4, M11 and M12 comprise a current mirror with wide variation. The transistors M11 and M12 copy the input current Iin, thus, the current passing through the transistor M13 is the same with the difference between the input current Iin and the reference current Iref. In addition, the transistors M13, M14, M15 and M16 comprise an output current mirror. However, the width of the transistors M15 and M16 are twice that of the transistors M13 and M14. Thus, the value of the output current Iout is twice the difference between the input current Iin and the reference current Iref. Here, the raising cascade transistors M9 and M10, the lowering cascade transistors M11 and M12, and the current mirror composed of transistors M13, M14, M15 and M16 comprise the current operation circuit.

The operation result of the one-bit ADC is shown:

$$Iout = 2(Iin - Iref) \quad \text{if } Iin > Iref \quad (1)$$
$$= Iin \quad \text{if } Iin < Iref$$

$$Y(i) = Hi \quad \text{if } Iin > Iref \quad (2)$$
$$= Lo \quad \text{if } Iin < Iref$$

As shown in FIG. 1, the ADC 100 is composed of the analog-to-digital converting units IADC-1~IADC-10 connected in serial. Thus, the output current Iout of the present-stage analog-to-digital converting unit is the input current Iin of the next-stage analog-to-digital converting unit. Thus, according to the formula (1), the value of the input current Iin is:

$$Iin = Y(9)*Iref + Y(8)*Iref/2^1 + \ldots + Y(0)*Iref/2^9 \quad (3)$$

Figure 5:
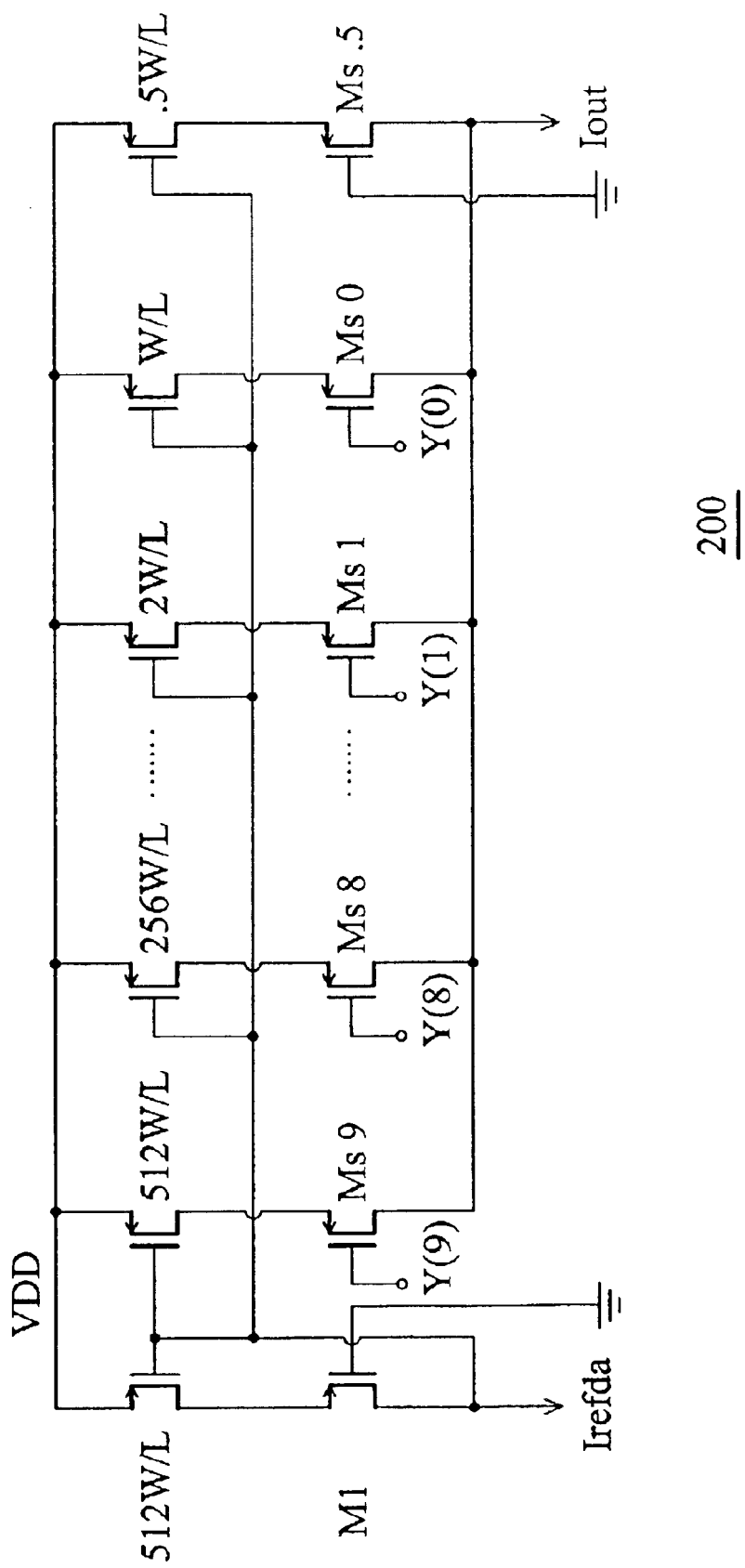
FIG. 5 shows a circuit of the DAC.

FIG. 5 shows a circuit of the DAC. DAC 200 comprises a plurality of current mirrors similar to the current mirror of the ADC to copy the reference current Iref. The aspect ratio of each current mirror of the DAC corresponds to the weight of the bits. The ADC 200 further comprises switches Ms0–Ms9 to receive the bit signals Y(0)–Y(9) of the ADCs 100 and output the return current to verify the transforming characteristic.

Figure 6:
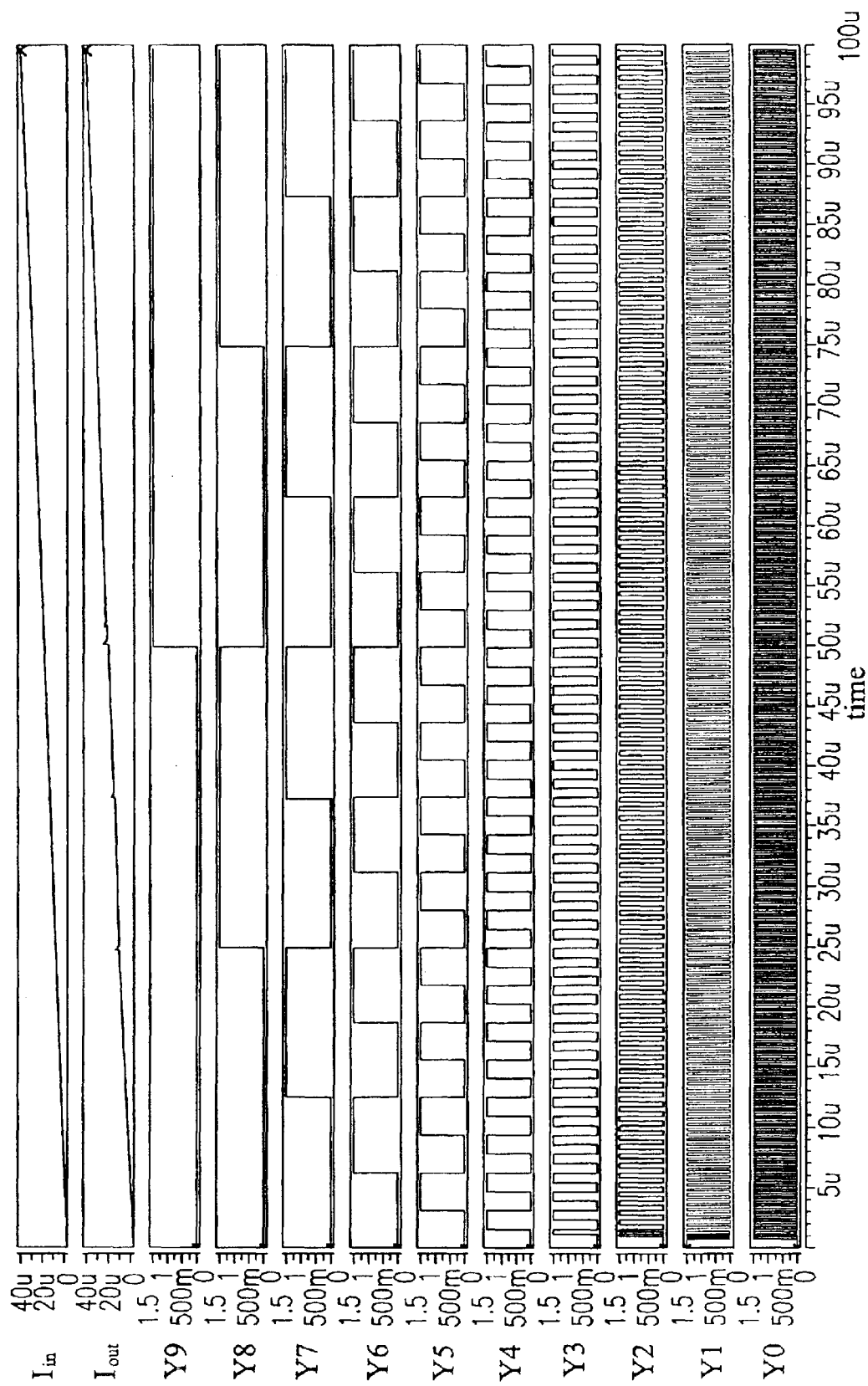
FIGS. 6–9 show the simulation result when the sampling frequency is 20 MHz.

FIGS. 6–9 show the simulation result when the sampling frequency is 20 MHz. Iin=(0.4t)uA/usec. The waveforms shown in FIG. 6 represent the signals of Iin, Iout, Y(9), Y(8), Y(7), Y(6), Y(5), Y(4), Y(3), Y(2), Y(1), and Y(0) in sequence.

Figure 7:
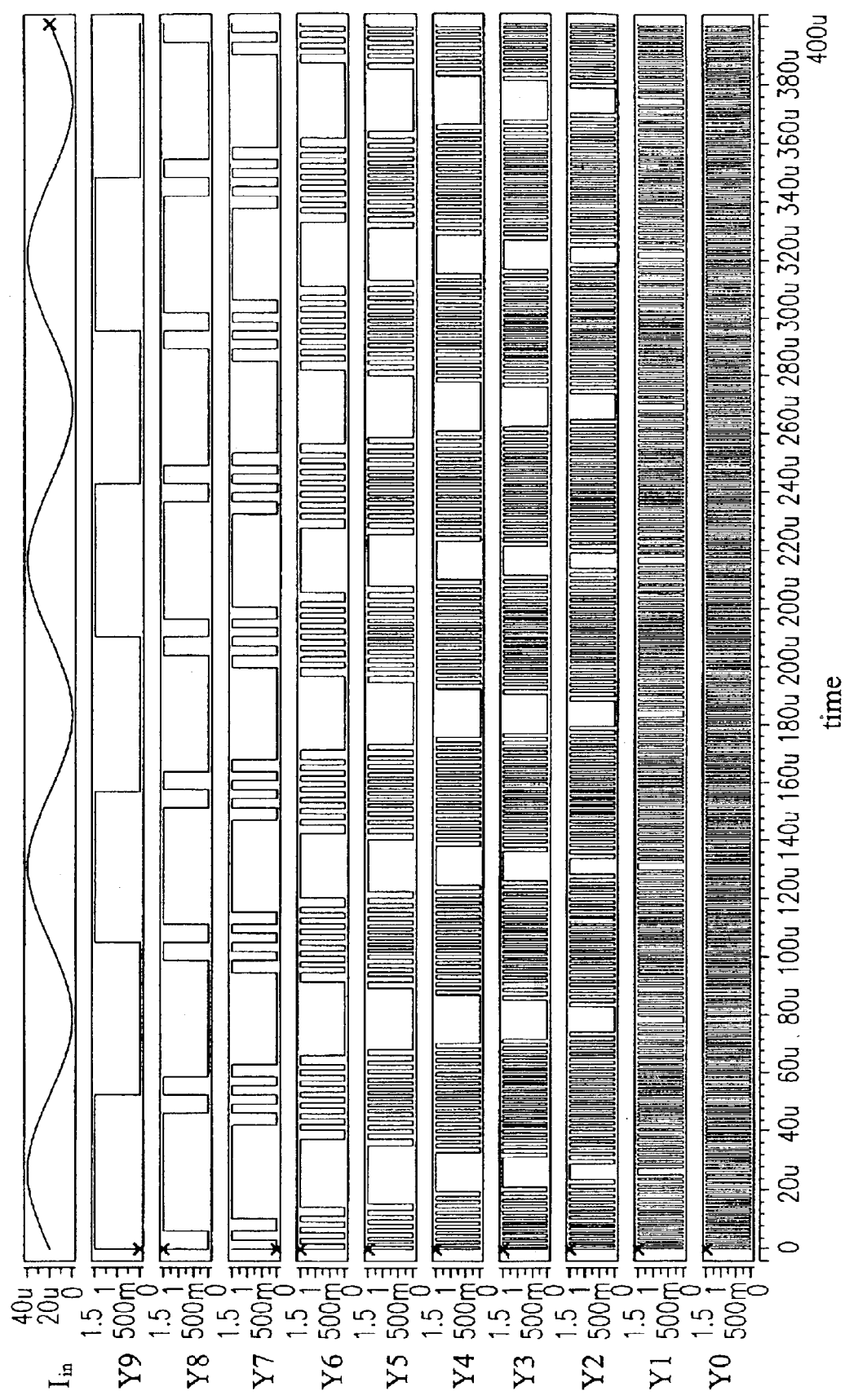

In FIG. 7, the input signal Iin=20.125+20.125 sin(2π*10⁴ t)uA. The waveforms shown in FIG. 7 represent the signals of Iin, Iout, Y(9), Y(8), Y(7), Y(6), Y(5), Y(4), Y(3), Y(2), Y(1), and Y(0) in sequence.

Figure 8:
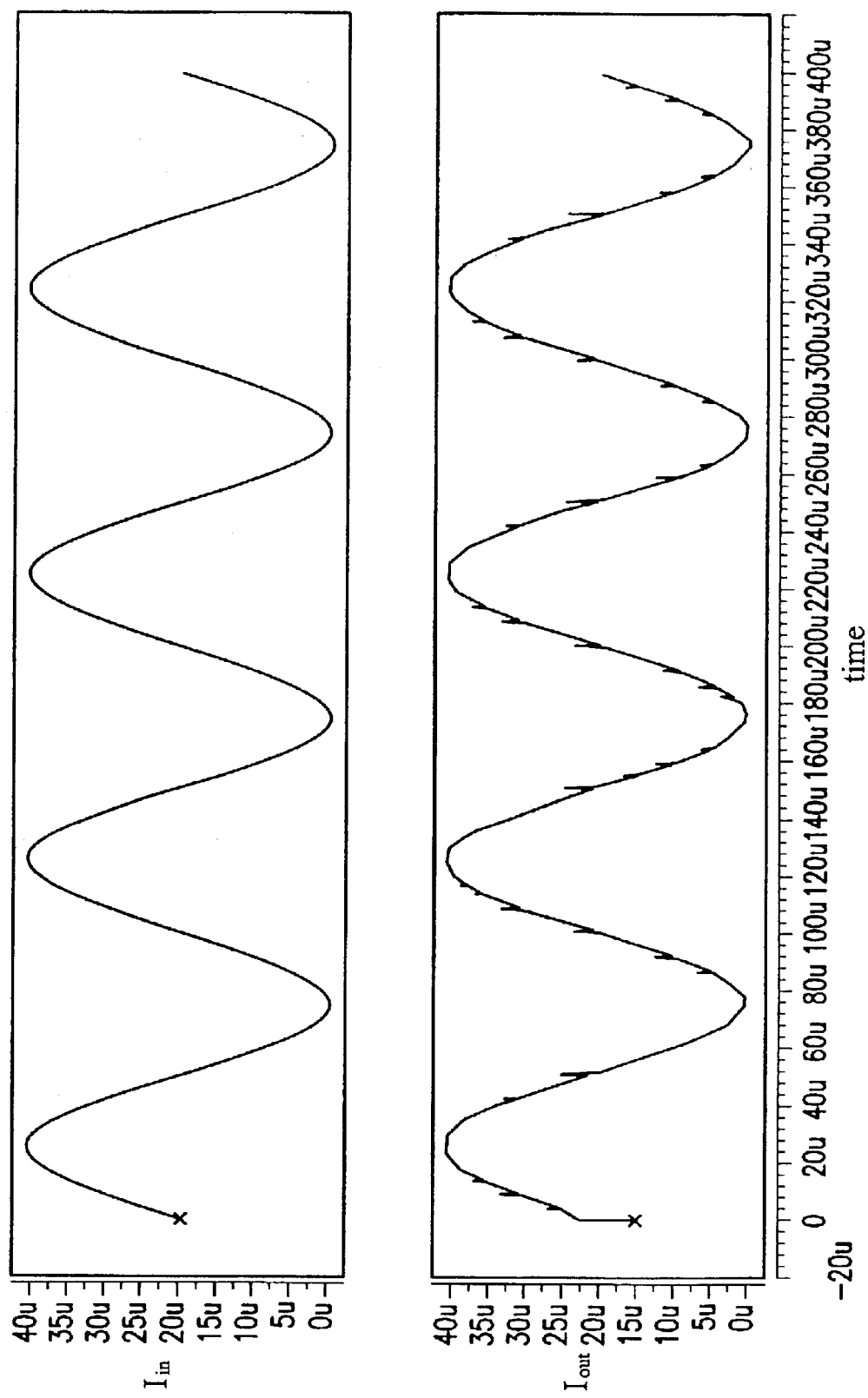

In FIG. 8, the input signal Iin=20.125+20.125 sin(2π*10⁴ t)uA. The waveforms shown in FIG. 7 represent the signals of Iin and Iout in sequence.

Figure 9:
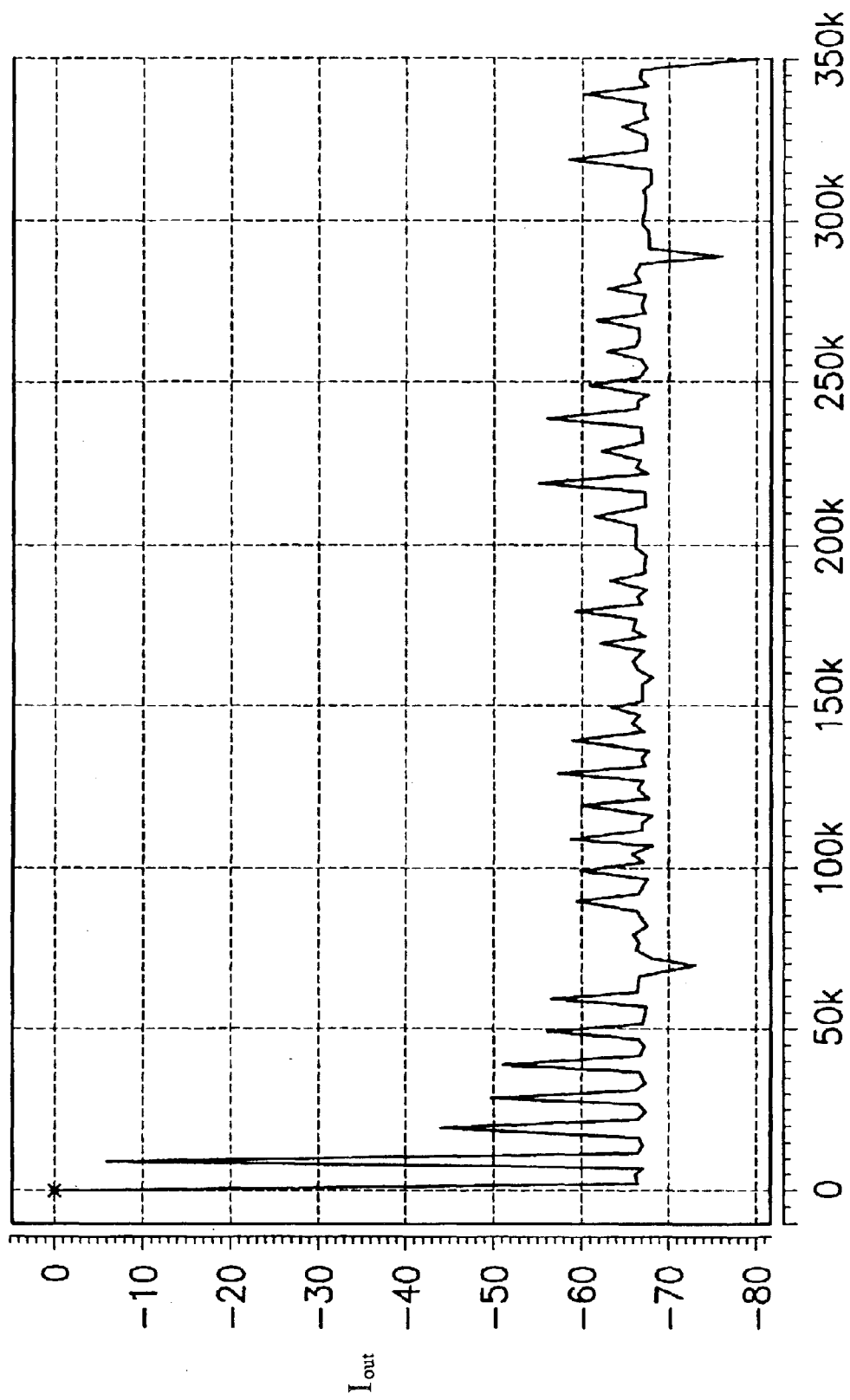

FIG. 9 shows the frequency spectrum of FIG. 8, the signal-noise ratio is 37.8 dB, and the total harmonic distortion is 1.96%.

The difference between the ADC according to the embodiment of the present invention and the conventional pipeline ADC is that the transforming of the first digital data of the pipeline ADC requires several clock periods. For example, an N-bit pipeline ADC requires at least N clocks to finish the transformation of the data, thus, data is not immediately output. In addition, the next bit transforms the clock signal of the present bit while the present bit transforms the clock signal. Thus, high accuracy is required by the amplifier and the comparator. Conventional pipeline ADCs require a plurality of floating and grounding capacitors to record the analog signals of each clock signal. The ADC of the present invention outputs the compared result to the next bit directly when the present bit finishes the comparison without having to wait for the next clock signal. In addition, the data type of the ADC of the present invention is current, so the capacitors are unnecessary. The data is transformed toward the LSB. Thus, the present invention discloses a chain-reaction ADC. The transformation time of N-bits is $N*T_p$, where $T_p$ is the delay time of one-bit ADC unit. Thus, the period of the clock signal must higher or equal to $N*T_p$. Therefore, the ADC of the present invention transforms data in real-time.

The advantages of the ADC according to the present invention are small chip size due to the circuit of the present invention only requiring one or two grounding capacitors and the floating capacitors are unnecessary, the delay time is shortened providing data in real-time, the high-accuracy amplifier is easily manufactured, the operating voltage and power required are low and external high voltage and decoding circuits are unnecessary. In addition, the chain-reaction ADC according to the present invention is suitable for merger with a single chip, thus realizing a system on a chip.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An analog-to-digital converter, comprising:
   a plurality of analog-to-digital converting units connected in serial, each analog-to-digital converting unit comprising:
   a current comparator having a current input terminal for receiving a sampling current, a reference current input terminal for receiving a reference current and a bit output terminal for outputting a bit signal;
   a current operation circuit having a current output terminal for outputting a compared current according to the sampling current and the reference current, and an operation controlling terminal for receiving the bit signal; and
   a first controlling terminal for receiving a clock signal to latch the bit signal, wherein the analog-to-digital converting units output the bit signals in sequence in a period of the clock signal, wherein the bit signal is at a high voltage level when the sampling current exceeds the reference current, and the bit signal is at a low voltage level when the reference current exceeds the sampling current; and
   a digital-to-analog converter comprising a plurality of current mirrors and second switches coupled to the current mirror for receiving the bit signal to generate a return current to be tested, wherein at least one current mirror generates a current corresponding to the bit signal according to the reference current.

2. The analog-to-digital converter as claimed in claim 1, wherein one of the analog-to-digital converting units maintains the sampling current when the clock signal is disabled.

3. The analog-to-digital converter as claimed in claim 1, wherein the compared current of the analog-to-digital converting unit is twice the difference between the sampling current and the reference current when the sampling current exceeds the reference current, and the compared current of the analog-to-digital converting unit is twice the sampling current when the sampling current is less than the reference current.

4. The analog-to-digital converter as claimed in claim 1, wherein the current comparator comprises:
   a raising current mirror having a plurality of first raising cascade transistors, first input terminals and first output terminals, wherein the first input terminals of the raising current mirror are coupled to the reference current input terminal of the current comparator to receive the reference current and the first output terminal of the raising current mirror outputs the sampling current;
   a lowering current mirror having a plurality of first lowering cascade transistors, second input terminals and second output terminals, wherein the second input terminals of the lowering current mirror is coupled to the current input terminal of the current comparator to receive the sampling current, and the second output terminal of the lowering current mirror outputs the sampling current and is coupled to the first output terminal of the raising current mirror;
   a comparator having a third input terminal and a third output terminal, wherein the third input terminal is coupled to the first output terminal of the raising current mirror; and
   a latch having a fourth input terminal, a fourth output terminal and a second controlling terminal, wherein the fourth input terminal is coupled to the third output terminal, the fourth output terminal outputs the bit signal and the second controlling terminal receives the clock signal and latches the signal of the third input terminal.

5. The analog-to-digital converter as claimed in claim 4, wherein one analog-to-digital converting unit further comprises:
   a first switch having a third controlling terminal for receiving the clock signal and is coupled between biased nodes of the second input terminal and the second output terminal; and
   a capacitor coupled between the biased nodes of the second output terminal.

6. The analog-to-digital converter as claimed in claim 1, wherein the current operation circuit comprises:
- a second raising cascade transistor having an operation controlling terminal and a fifth output terminal, wherein the operation controlling terminal is coupled to the third output terminal, the fifth output terminal is turned off when the third output terminal is at a high voltage level and a bias of the second raising cascade transistor is the same with the raising current mirror to output the reference current;
- a second lowering cascade transistor having a sixth output terminal, wherein a bias of the second lowering cascade transistor is the same with the lowering current mirror to output the sampling current and the second lowering cascade transistor is coupled to the fifth output terminal; and
- an output current mirror having a plurality of third raising cascade transistors, seventh input terminals, and seventh output terminals for outputting current twice that of the input terminal, wherein the seventh input terminal is coupled to the sixth output terminal.

7. An analog-to-digital converter, comprising:
- a plurality of analog-to-digital converting units connected in serial, each analog-to-digital converting unit comprising a current input terminal for receiving a sampling current, a reference current input terminal for receiving a reference current, a bit output terminal for outputting a bit signal, a current output terminal for outputting a compared current, and a first controlling terminal for receiving a clock signal to latch the bit signal,
- wherein the current output terminal of the analog-to-digital converting unit is connected to the current input terminal of the next analog-to-digital converting unit, and the analog-to-digital converting units output the bit signals in sequence in a period of the clock signal, and wherein the compared current of the analog-to-digital converting unit is twice the difference between the sampling current and the reference current when the sampling current exceeds the reference current, and the compared current of the analog-to-digital converting unit is twice the sampling current when the sampling current is less than the reference current.

8. The analog-to-digital converter as claimed in claim 7, wherein one of the analog-to-digital converting units maintains the sampling current when the clock signal is disabled.

9. The analog-to-digital converter as claimed in claim 7, wherein the bit signal is at a high voltage level when the sampling current exceeds the reference current, and the bit signal is at a low voltage level when the reference current exceeds the sampling current.

10. The analog-to-digital converter as claimed in claim 7, wherein the analog-to-digital converting unit comprises:
- a raising current mirror having a plurality of first raising cascade transistors, first input terminals and first output terminals, wherein the first input terminals of the raising current mirror are coupled to the reference current input terminal to receive the reference current and the first output terminal of the raising current mirror outputs the sampling current;
- a lowering current mirror having a plurality of first lowering cascade transistors, second input terminals and second output terminals, wherein the second input terminals of the lowering current mirror are coupled to the current input terminal to receive the sampling current, and the second output terminal of the lowering current mirror outputs the sampling current and is coupled to the first output terminal of the raising current mirror;
- a comparator having a third input terminal and a third output terminal, wherein the third input terminal is coupled to the first output terminal of the raising current mirror;
- a latch having a fourth input terminal, a fourth output terminal and a second controlling terminal, wherein the fourth input terminal is coupled to the third output terminal, the fourth output terminal outputs the bit signal and the second controlling terminal receives the clock signal and latches the signal of the third input terminal;
- a second raising cascade transistor having an operation controlling terminal and a fifth output terminal, wherein the operation controlling terminal is coupled to the third output terminal, the fifth output terminal is turned off when the third output terminal is at a high voltage level and a bias of the second raising cascade transistor is the same with the raising current mirror to output the reference current;
- a second lowering cascade transistor having a sixth output terminal, wherein a bias of the second lowering cascade transistor is the same with the lowering current mirror to output the sampling current and the second lowering cascade transistor is coupled to the fifth output terminal; and
- an output current mirror having a plurality of third raising cascade transistors, seventh input terminals, and seventh output terminals for outputting current twice that of the input terminal, wherein the seventh input terminal is coupled to the sixth output terminal.

11. The analog-to-digital converter as claimed in claim 10, wherein one of the analog-to-digital converting units further comprises:
- a first switch having a third controlling terminal for receiving the clock signal and coupled between biased nodes of the second input terminal and the second output terminal; and a capacitor coupled between the biased nodes of the second output terminal.

12. The analog-to-digital converter as claimed in claim 7, further comprising a digital-to-analog converter comprising a plurality of current mirrors and second switches coupled to the current mirror for receiving the bit signal to generate a return current to be tested, wherein at least one current mirror generates a current corresponding to the bit signal according to the reference current.

13. An analog-to-digital converter, comprising:
- a plurality of analog-to-digital converting units connected in serial, each analog-to-digital converting unit comprising:
- a current comparator having a current input terminal for receiving a sampling current, a reference current input terminal for receiving a reference current and a bit output terminal for outputting a bit signal;
- a current operation circuit having a current output terminal for outputting a compared current according to the sampling current and the reference current, and an operation controlling terminal for receiving the bit signal; and
- a first controlling terminal for receiving a clock signal to latch the bit signal, wherein the analog-to-digital converting units output the bit signals in sequence in a period of the clock signal, wherein the compared current of the analog-to-digital converting unit is twice the difference between the sampling current and the reference current when the sampling current exceeds the reference current, and the compared current of the analog-to-digital converting unit is twice the sampling current when the sampling current is less than the reference current.

14. The analog-to-digital converter as claimed in claim 13, wherein one of the analog-to-digital converting units maintains the sampling current when the clock signal is disabled.

15. An analog-to-digital converter, comprising:

a plurality of analog-to-digital converting units connected in serial, each analog-to-digital converting unit comprising:

a current comparator having a current input terminal for receiving a sampling current, a reference current input terminal for receiving a reference current and a bit output terminal for outputting a bit signal, wherein the current comparator comprises:

a raising current mirror having a plurality of first raising cascade transistors, first input terminals and first output terminals, wherein the first input terminals of the raising current mirror are coupled to the reference current input terminal of the current comparator to receive the reference current and the first output terminal of the raising current mirror outputs the sampling current;

a lowering current mirror having a plurality of first lowering cascade transistors, second input terminals and second output terminals, wherein the second input terminals of the lowering current mirror is coupled to the current input terminal of the current comparator to receive the sampling current, and the second output terminal of the lowering current mirror outputs the sampling current and is coupled to the first output terminal of the raising current mirror;

a comparator having a third input terminal and a third output terminal, wherein the third input terminal is coupled to the first output terminal of the raising current mirror; and a latch having a fourth input terminal, a fourth output terminal and a second controlling terminal, wherein the fourth input terminal is coupled to the third output terminal, the fourth output terminal outputs the bit signal and the second controlling terminal receives the clock signal and latches the signal of the third input terminal.

a current operation circuit having a current output terminal for outputting a compared current according to the sampling current and the reference current, and an operation controlling terminal for receiving the bit signal; and a first controlling terminal for receiving a clock signal to latch the bit signal, wherein the analog-to-digital converting units output the bit signals in sequence in a period of the clock signal.

16. The analog-to-digital converter as claimed in claim 15, wherein the compared current of the analog-to-digital converting unit is twice the difference between the sampling current and the reference current when the sampling current exceeds the reference current, and the compared current of the analog-to-digital converting unit is twice the sampling current when the sampling current is less than the reference current.

17. The analog-to-digital converter as claimed in claim 15, wherein one analog-to-digital converting units further comprises:

a first switch having a third controlling terminal for receiving the clock signal and is coupled between biased nodes of the second input terminal and the second output terminal; and a capacitor coupled between the biased nodes of the second output terminal.

18. An analog-to-digital converter, comprising:

a plurality of analog-to-digital converting units connected in serial, each analog-to-digital converting unit comprising:

a current comparator having a current input terminal for receiving a sampling current, a reference current input terminal for receiving a reference current and a bit output terminal for outputting a bit signal;

a current operation circuit having a current output terminal for outputting a compared current according to the sampling current and the reference current, and an operation controlling terminal for receiving the bit signal;

a digital-to-analog converter comprising a plurality of current mirrors and second switches coupled to the current mirror for receiving the bit signal to generate a return current to be tested, wherein each digital-to-analog converter generates a current corresponding to the bit signal according to the reference current; and a first controlling terminal for receiving a clock signal to latch the bit signal, wherein the analog-to-digital converting units output the bit signals in sequence in a period of the clock signal.

19. The analog-to-digital converter as claimed in claim 18, further comprising a digital-to-analog converter comprising a plurality of current mirrors and second switches coupled to the current mirror for receiving the bit signal to generate a return current to be tested, wherein each digital-to-analog converter generates a current corresponding to the bit signal according to the reference current.

* * * * *